United States Patent [19]

Teschner, III et al.

[11] Patent Number: 5,458,432
[45] Date of Patent: Oct. 17, 1995

[54] UNIT TRAY HOLD DOWN MECHANISM

[75] Inventors: Charles W. Teschner, III, Nashua, N.H.; Kevin R. Frey, Peoria; Adam Sunshine, Phoenix, both of Ariz.

[73] Assignee: Honeywell Inc., Minneapolis, Minn.

[21] Appl. No.: 193,821

[22] Filed: Feb. 9, 1994

[51] Int. Cl.[6] .................... F16B 2/00; H05K 7/14
[52] U.S. Cl. .................. 403/374; 403/373; 403/409.1; 403/322; 292/251; 292/256.75; 361/798
[58] Field of Search .................... 403/373, 374, 403/322, 321, 409.1, 13, 14, 405.1; 24/287; 439/803, 812; 411/551; 292/251, 256.73, 256.75, 256.5; 361/796, 798, 801, 759; 174/58, 53; 269/24, 234, 217; 312/263; 410/77, 82, 83; 74/89.15

[56] References Cited

U.S. PATENT DOCUMENTS

| | | | |
|---|---|---|---|
| 757,209 | 4/1904 | Long | 292/251 X |
| 4,113,395 | 9/1978 | Pawsat et al. | 403/374 X |
| 4,744,692 | 5/1988 | Olsen et al. | 403/409.1 X |
| 4,830,316 | 5/1989 | Nehl | 411/551 X |
| 4,830,530 | 5/1989 | Meineke | 292/256.75 X |
| 4,882,655 | 11/1989 | Pavie | 361/759 X |
| 5,267,658 | 12/1993 | Schwenk et al. | 361/796 X |
| 5,363,281 | 11/1994 | Baitz et al. | 361/801 |

FOREIGN PATENT DOCUMENTS

| | | | |
|---|---|---|---|
| 1435392 | 3/1966 | France | 292/256.73 |
| 4-97596 | 3/1992 | Japan | 361/796 |
| 1525958 | 11/1989 | U.S.S.R. | 361/759 |
| 14803 | of 1897 | United Kingdom | 292/251 |

Primary Examiner—Anthony Knight
Attorney, Agent, or Firm—Arthur A. Sapelli

[57] ABSTRACT

The hold down apparatus securely engages a unit onto a tray. The tray includes an opening having a front block on the underside of the tray at the opening. The front block also includes a pin. The apparatus comprises a housing having an internal space and is placed in the unit such that the housing space is opened to an opening in the bottom of the unit. A control shaft extends from outside the apparatus and into the housing space to the backplate of the housing. The portion of the control shaft in the housing space is threaded. The external portion of the control shaft is accessible from the front of the unit. An L-shaped pawl has a foot and a rise, the foot of the pawl having a notch in the front edge of the foot. The pawl also has a threaded hole in the rise along an axis parallel to the foot such that when the control shaft is turned the foot of the pawl extends into the opening of the tray from an initial recessed position in the housing space, and is then moved forward causing the notch of the foot to engage the pin of the tray thereby securely holding the unit to the tray.

7 Claims, 10 Drawing Sheets

UNIT TRAY HOLD DOWN MECHANISM

BACKGROUND OF THE INVENTION

The present invention relates to a clamp (hold down mechanism), and more particularly, to a hold down apparatus securely engaging a unit, including electronic instruments, onto a tray for receiving the unit.

Presently, line replaceable units (LRU) of an aircraft include the instruments (altimeter, display unit,...) which can be readily replaced by removing the unit from the tray designed to receive the unit and inserting another like unit in its place. Presently, the units have a jack screw which runs the entire length of the unit and screws into the back of the tray to secure the unit in place. Sometimes, a second jack screw is included for locking the unit in place. This arrangement utilized space in the unit which can otherwise be eliminated or utilized differently, i.e., more efficiently.

The present invention is an improvement over the prior hold down mechanisms. The present invention uses less space in the unit, and insures proper retention in the tray.

SUMMARY OF THE INVENTION

Therefore, there is provided by the present invention, an improved hold down mechanism. The hold down mechanism (or apparatus) securely engages a unit onto a tray. The tray includes an opening in the bottom of the tray along with a front and rear block on the underside of the tray at the opening. The apparatus is placed in the unit at an opening in the bottom of the unit. The front block also includes a pin. The apparatus comprises a housing, having a front plate, a first and second side plate, a back plate, and a bottom plate creating an internal housing space. The housing is placed in the unit such that the internal housing space is opened to the opening of the bottom of the unit. A control shaft extends from outside the apparatus through the front plate and into the housing space to the backplate. The portion of the control shaft in the housing space is threaded. The external portion of the control shaft is accessible from the front of the unit. A pawl, the pawl being L-shape, has a foot and a rise, the foot of the pawl having a notch in the front edge of the foot. The pawl also has a threaded hole in the rise along an axis parallel to the foot and perpendicular to the front edge of the foot, such that when the control shaft is turned the foot of the pawl extends into the opening of the tray from an initial recessed position in the housing space, and is then moved toward the front plate of the apparatus causing the notch of the foot to engage the pin of the tray thereby securely holding the unit to the tray.

Accordingly, it is an object of the present invention to provide an apparatus to secure a unit to a tray.

It is another object of the present invention to provide a mechanism to secure a unit to a tray whereby the mechanism utilizes a small amount of space within the unit.

These and other objects of the present invention will become more apparent when taken in conjunction with the following description and attached drawings, wherein like characters indicate like parts, and which drawings form a part of the present application.

BRIEF DESCRIPTION OF THE DRAWINGS

FIG. 6 which comprise

DETAILED DESCRIPTION

The present invention will be described by first describing the hold down mechanism itself and then by describing the hold down mechanism as it resides in a LRU (such as an altimeter, display unit,...) or sometimes referred to herein more simply as a unit, and how it mates with a tray to achieve the locking feature which secures the unit to the tray.

Figure 1:
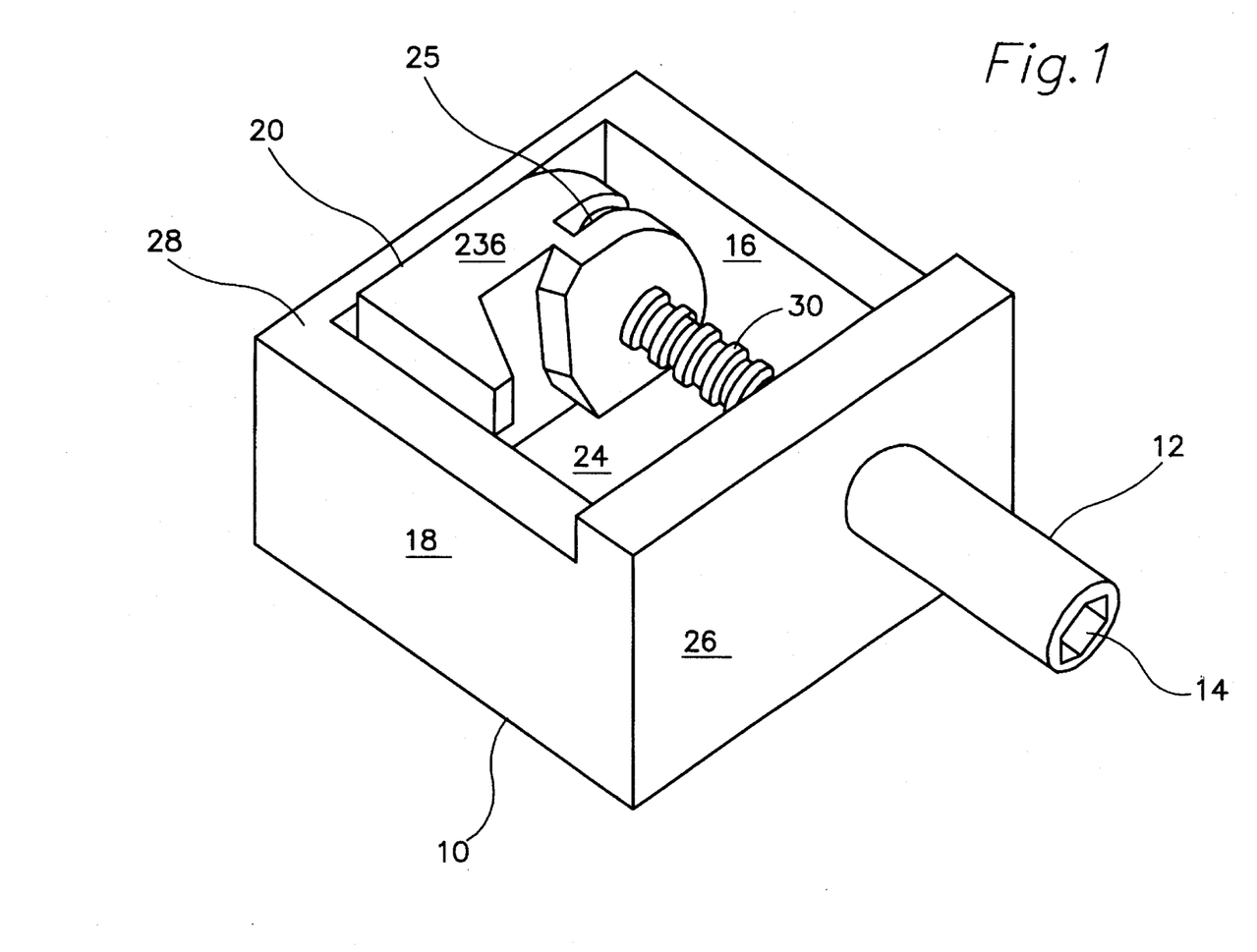
FIG. 1 shows an isometric view of the hold down mechanism of the present invention.

Referring to FIG. 1, there is shown an isometric view of the hold down mechanism of the preferred embodiment of the present invention.

The hold down mechanism, or more simply the mechanism, includes a housing 10, which includes a bottom plate 24, a front plate 26, a first and second side plate, 16, 18, and a back plate 28. A control shaft 12 is inserted through the front plate and extends into the inside of the housing 10 through to the back plate. The portion of the control shaft inside the housing is threaded to contain a control screw 30, the control shaft being flanged such that the threaded portion remains inside the internal housing space. A pawl 20 is also inside the housing and includes a threaded hole to receive the control screw. The end of the control shaft includes a control shaft coupler 14. Although the preferred embodiment of the present mechanism shows a receptacle for an allen type wrench it will be appreciated by those skilled in the art that the coupling can be via a recession which accepts a phillips head screwdriver, a slot to accept a normal screwdriver, .... Initially the pawl 20 resides in the housing in a recessed position as shown in FIG. 1 and is essentially in contact with the back plate 28 of housing 10.

Figure 2:
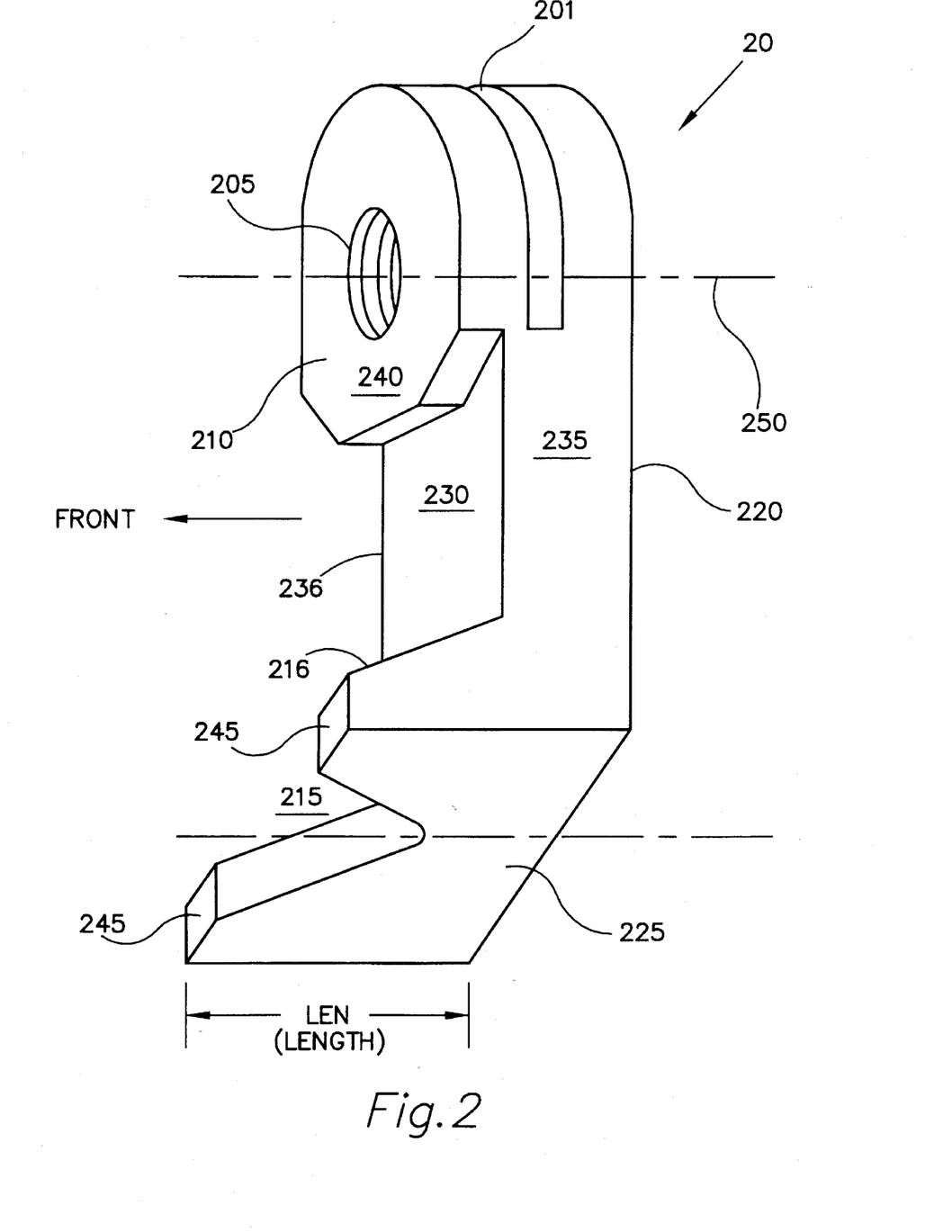
FIG. 2 shows an isometric view of the pawl included in the hold down mechanism of the preferred embodiment of the present invention.

Referring to FIG. 2, there is shown an isometric view of the pawl 20. The pawl 20 of the preferred embodiment of the present invention is an L-shaped element having a foot 225 (or base) of the L-shaped pawl, and a rise 220 of the L-shaped pawl 20. The front edge of the foot 245 includes a notch 215 in the front edge of the foot, the foot of the L-shaped pawl having a length (LEN) and the upper surface of the base is sloped (or inclined). The rise of the L-shaped pawl 220 is defined such that a front face of the rise 230 is perpendicular to a front axis. The pawl includes a first and second side surface of the rise 235, 236. The top portion of the rise is rounded such that the top surface is curved relative to a first axis 250 which is perpendicular to the front face of the rise 230. Further a threaded hole 205 is included to receive the control screw 30, the threaded hole having an axis coincident with the first axis 250. A slot 201 is included which runs from the top of the rise of the L-shape pawl and is parallel to the front face of the rise sufficiently deep to accept a washer 25 (in the preferred embodiment a nylon washer is included). Further, a pedestal 210 is included on the upper portion of the front face of the rise 230, the pedestal including a front face 240.

Figure 3:
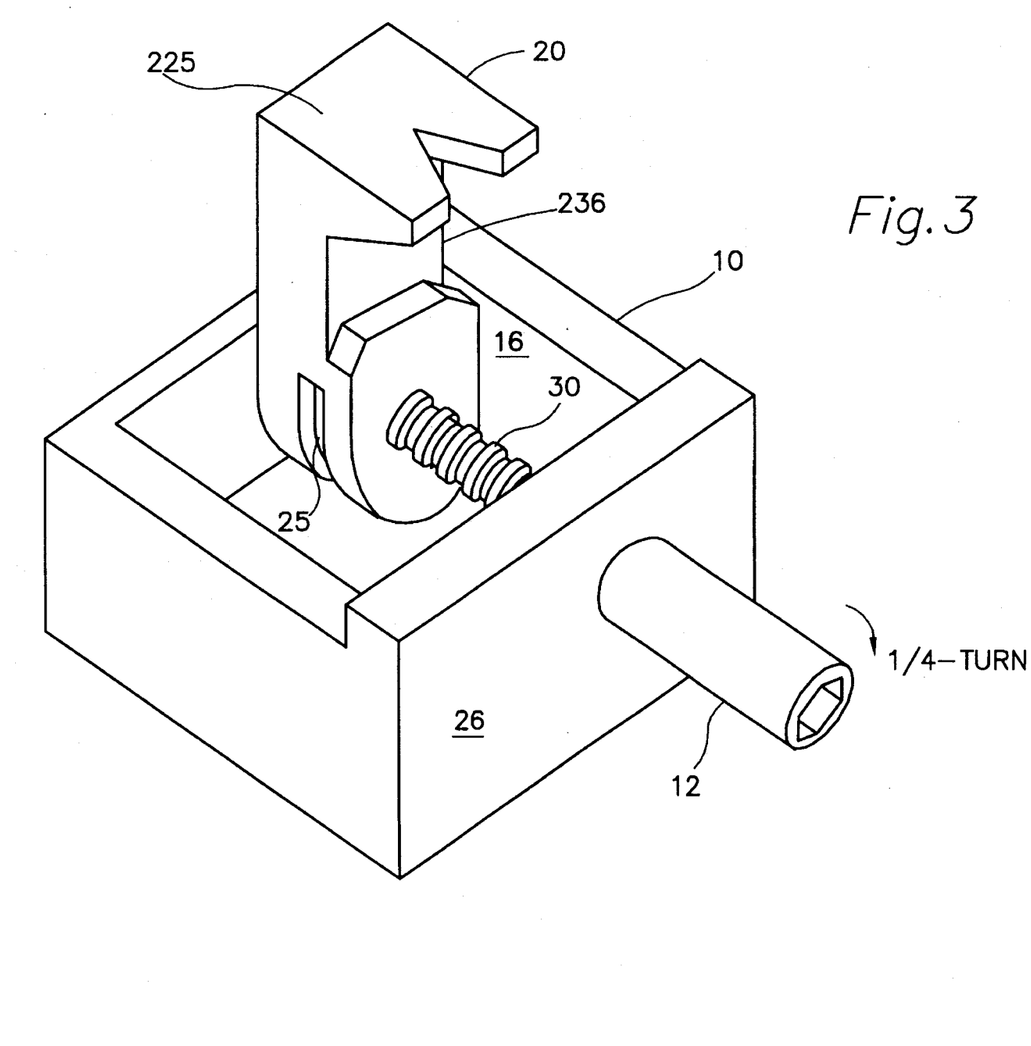
FIG. 3 shows an isometric view of the mechanism after a control shaft has been turned one-quarter turn from an initial position.

Referring to FIG. 3, there is shown an isometric view of the mechanism after the control shaft 12 has been turned ¼ turn from initial position. The pawl 20 rotates to a position 90° from its initial position such that the foot of the pawl 225 extends out of the housing 10 and is of sufficient height to hook onto a tray, as will be described hereinunder. The washer 25 creates enough friction between the pawl and the control screw 30 such that the pawl does not spin freely on the control thread but creates sufficient force to lift the pawl to its 90° position. Upon turning the control shaft 12 further, the second side surface of the rise 236 comes in contact with the inner surface of first side plate 16 such that the pawl can no longer rotate, but starts to move toward the front plate 26 along the control screw 30.

Figure 4:
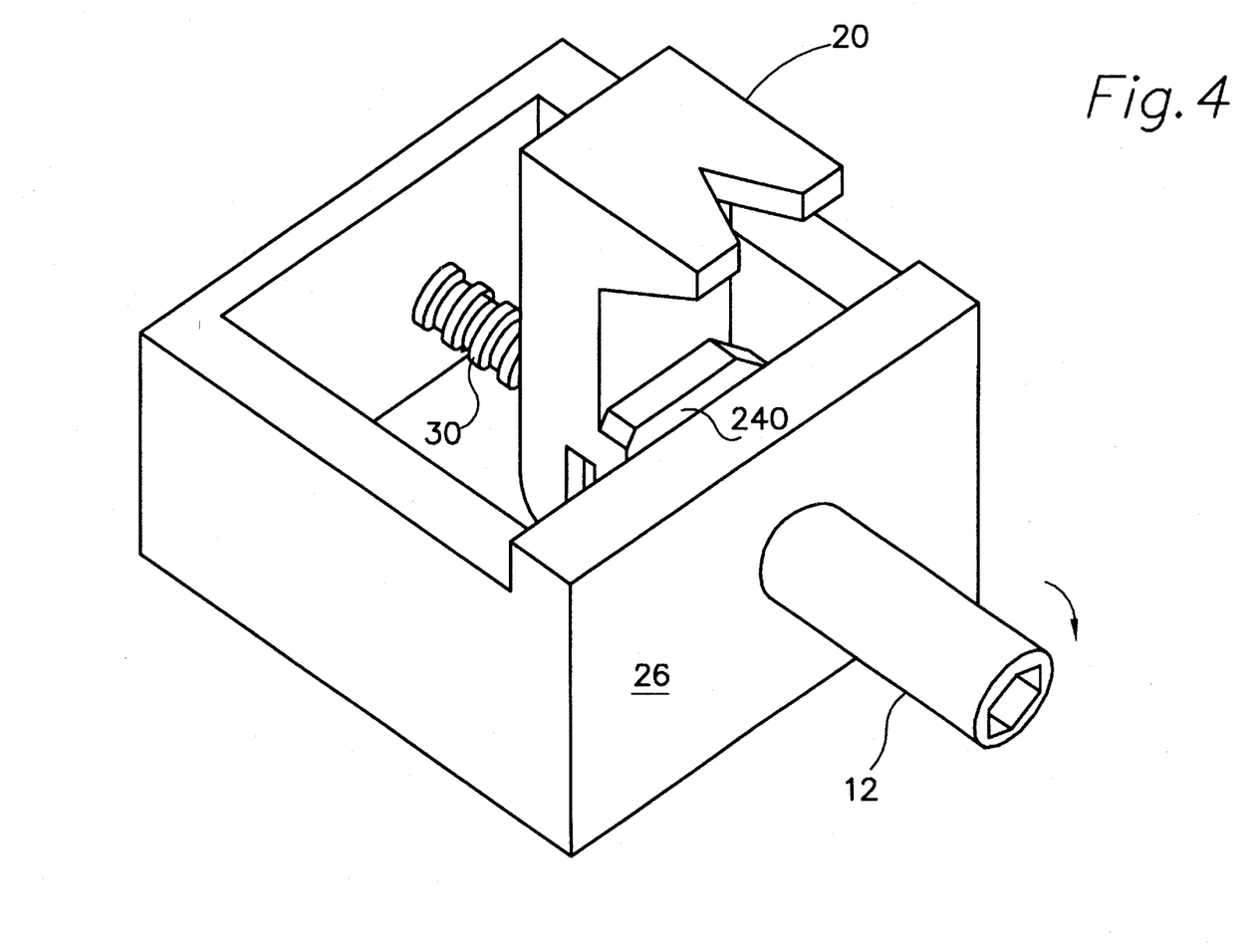
FIG. 4 shows the mechanism in a fully locked position.

Referring to FIG. 4, the control shaft 12 continues to rotate (as a result of force exerted by an operator) until the pawl reaches a fully locked position. In this case the front face of the pedestal 240 is in contact with the inside surface of the front plate 26.

Figure 5:
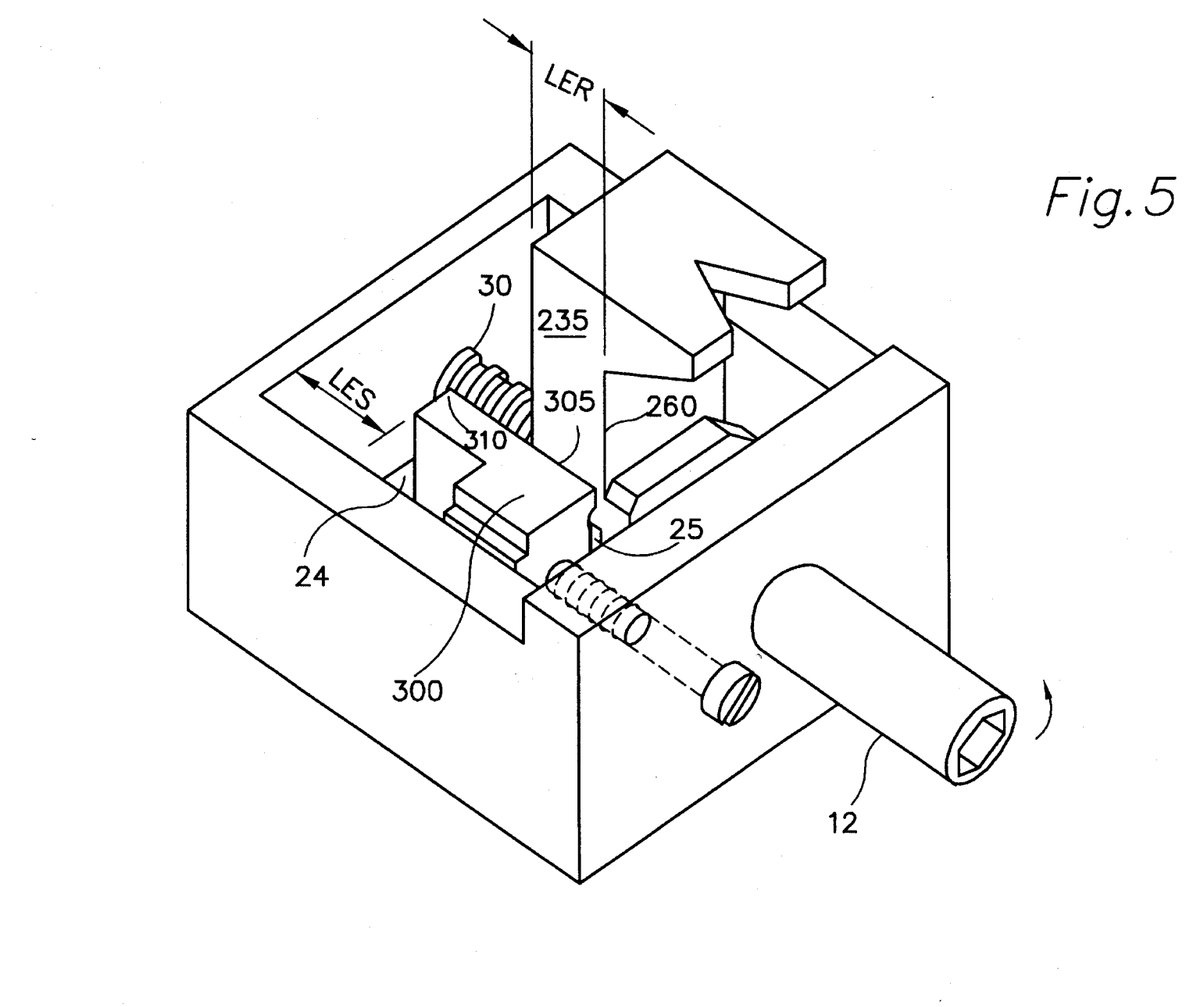
FIG. 5 shows the mechanism which includes the addition of a retention block to assist in going back to the initial position.

Referring to FIG. 5, there is shown the mechanism of the preferred embodiment of the present invention which includes the addition of a retention block to assist the pawl in returning back to the initial position. In order to go back to the initial position, the control shaft 12 is rotated in a direction opposite from the previous rotation. Without the retention block, and without any other interference, upon rotating the control shaft 12 in a counter-rotation, i.e., counter-clockwise position (in this particular case), the pawl 20 would rotate along with the shaft 90° until the first side surface of the rise 235 came in contact with the bottom plate 24 due to the action of the washer 25 against the control screw 30. However, a retention block 300 is included such that upon rotating the control shaft 12 in the counter clockwise direction in the preferred embodiment, the first side surface of the rise 235 of pawl 20 would come in contact with a surface 305 of the retention block 300. As a result the pawl 20 would remain in its upright position and would move toward the backplate 28 until the edge 260 (the edge of the pawl formed by the first surface of the rise 235 and the front face of the rise 230) reached the edge of the retention block 310. At this point the width of the rise LER would be sufficient to fit in the slot between the edge of the retention block 310 and the backplate surface 28 (the slot denoted as LES) at which point in time the pawl would have no interference to keep it in the 90° position and would then rotate into its initial (or stowed) recessed position. The retention block provides a deterministic position for the initial position of the pawl 20. In operation a pin (not shown, but will be explained hereinunder), can be utilized to maintain the pawl 20 in the upright position to obtain the "unlock" condition of the mechanism.

Figure 6A:
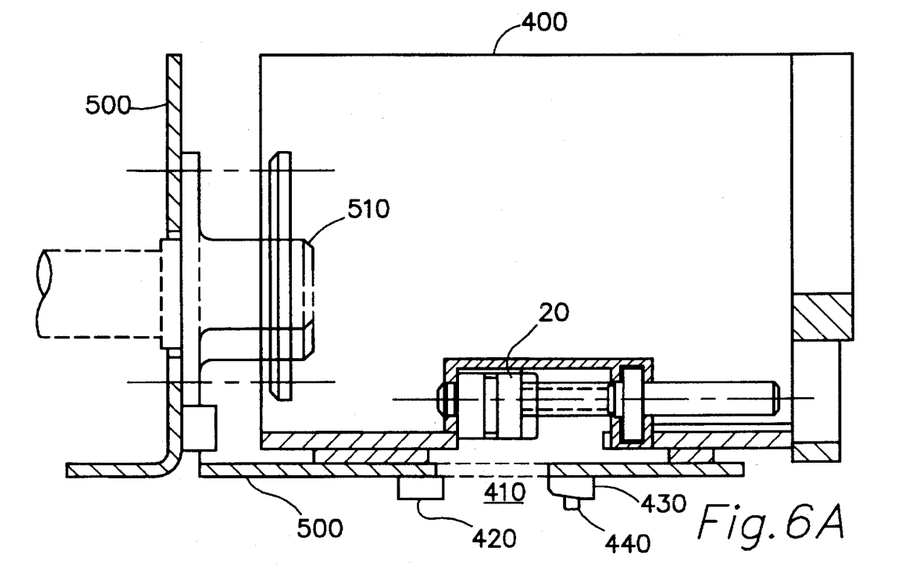
FIG. 6A, 6B, and 6C shows a cross-sectional view of the mechanism residing in a line replaceable unit (LRU) in its initial position in a tray, from a side view, top view, and front view, respectively.
Figure 6B:
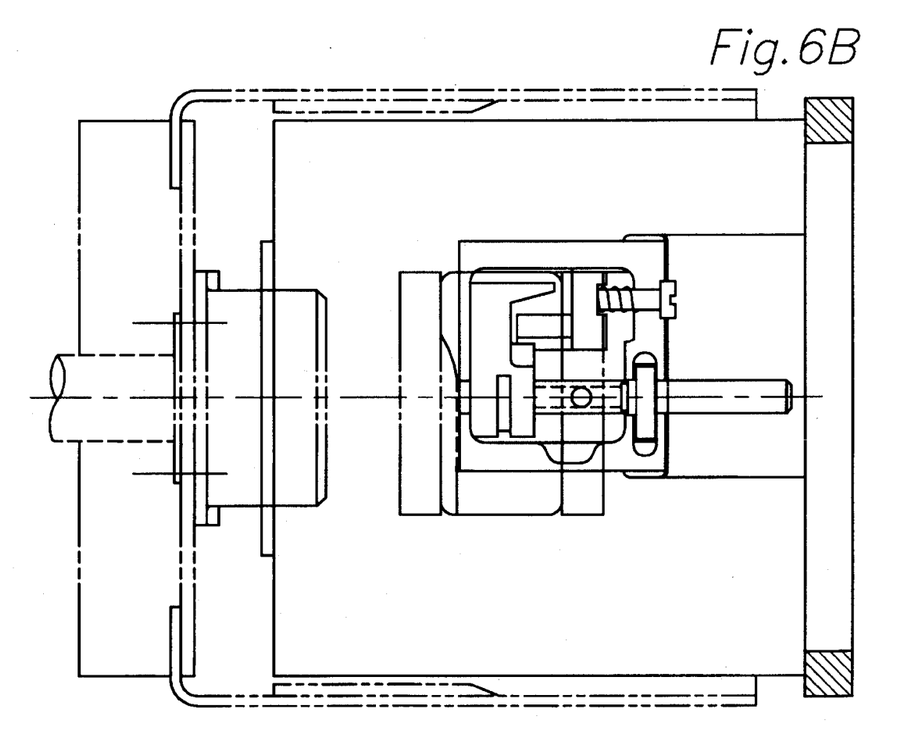
Figure 6C:
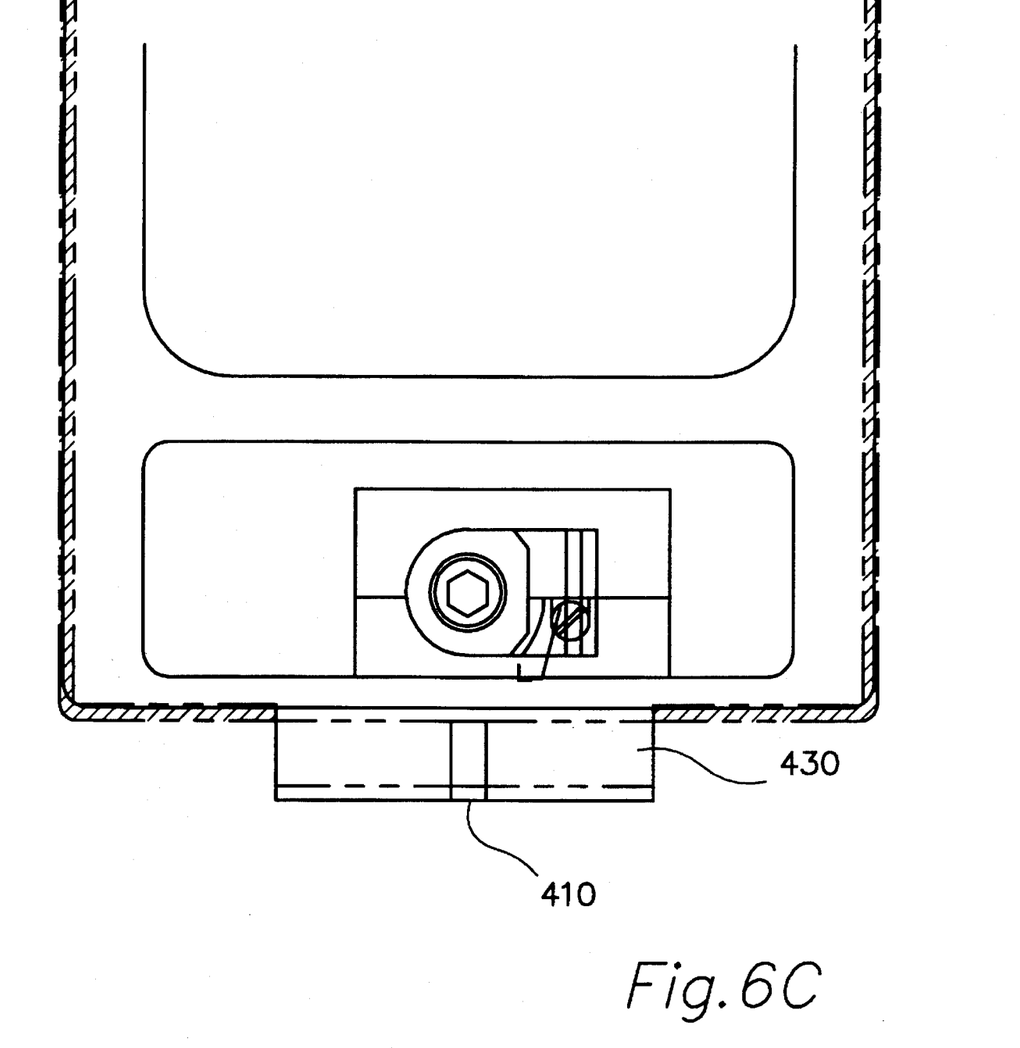

Having described the operation of the mechanism, referring to FIG. 6, there is shown a cross sectional view of the mechanism residing in a line replaceable unit (LRU) 400. A tray 500 is shown which includes a connector 510 which is to plug into a corresponding connector in the LRU and includes an opening in the tray 410, a rear block 420, and a front block 430, the front block 430 including a pin 440. When the LRU is placed on the tray the pawl 20 is in its stowed position and is opposite the opening in the tray 410.

Figure 7:
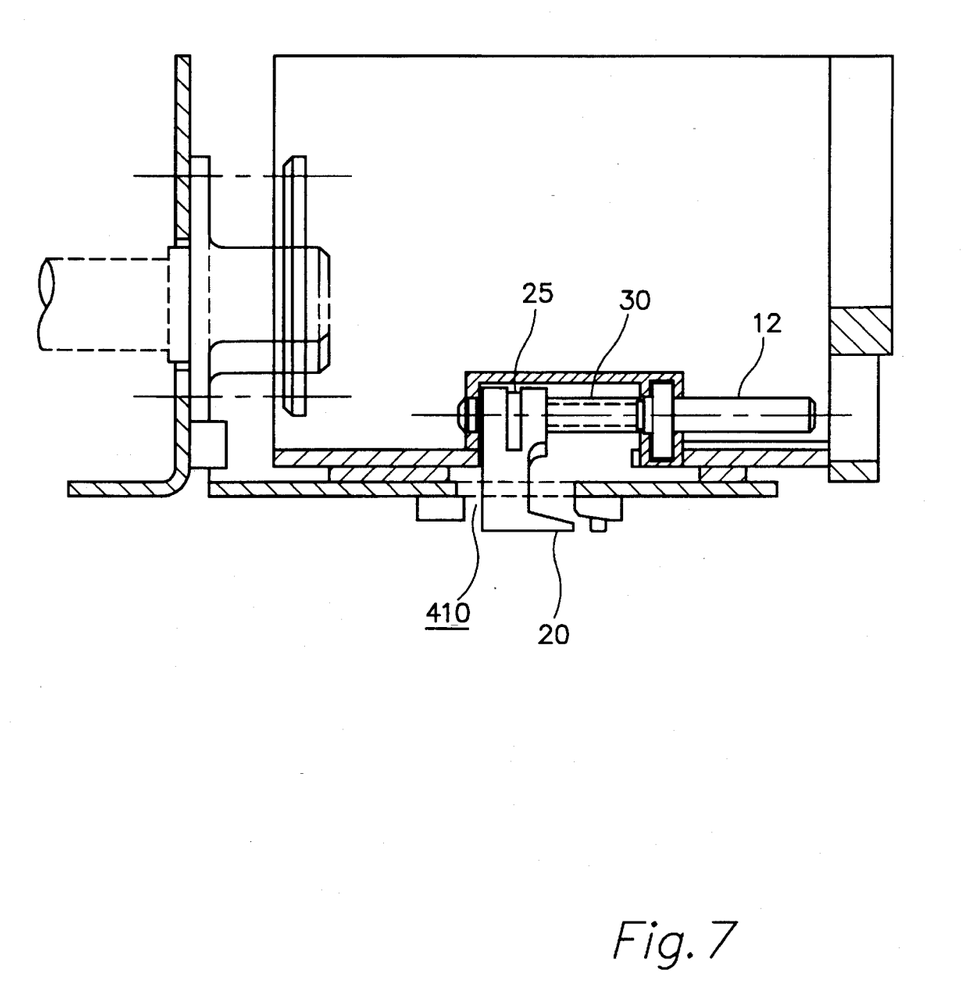
FIG. 7 shows a cross-section view of the start of locking the LRU to the tray.
Figure 8:
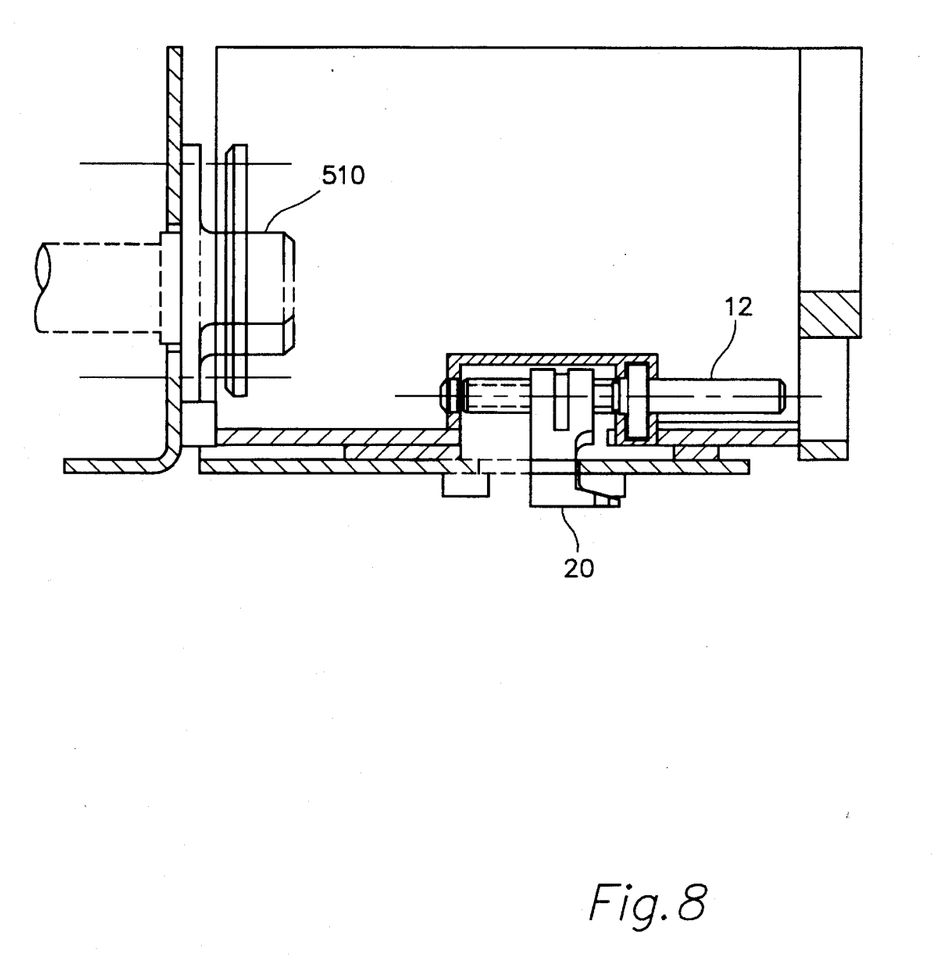
FIG. 8 shows a cross-sectional view of the LRU (and the apparatus) in its locked, or fully engaged position and the connectors fully mated.

Referring to FIG. 7, there is shown a cross sectional view of the starting of the locking operation of the LRU to the tray 500. When the control shaft 12 is rotated 90° the pawl 20 is rotated a corresponding 90° into the opening 410 of the tray, since the pawl has no obstructions and rotates as described above in conjunction with FIG. 3. As the control shaft 12 is rotated in the clockwise position the pawl 20 moves along the control screw 30 towards the front plate 26 of the mechanism. In the process, the notch 215 engages with pin 440, as shown in FIG. 8, and the inclined surface of the base of the pawl 20 rides along the incline surface of front block 430. As the control shaft 12 is rotated further after the notch 215 and the pin 440 are engaged, the LRU is moved toward the back end of the tray such that the connectors 510 of the tray mates completely with the corresponding connector of the LRU. In this manner the LRU is securely locked to the tray, and the connectors 510 of the tray and of the LRU are fully mated.

Figure 9:
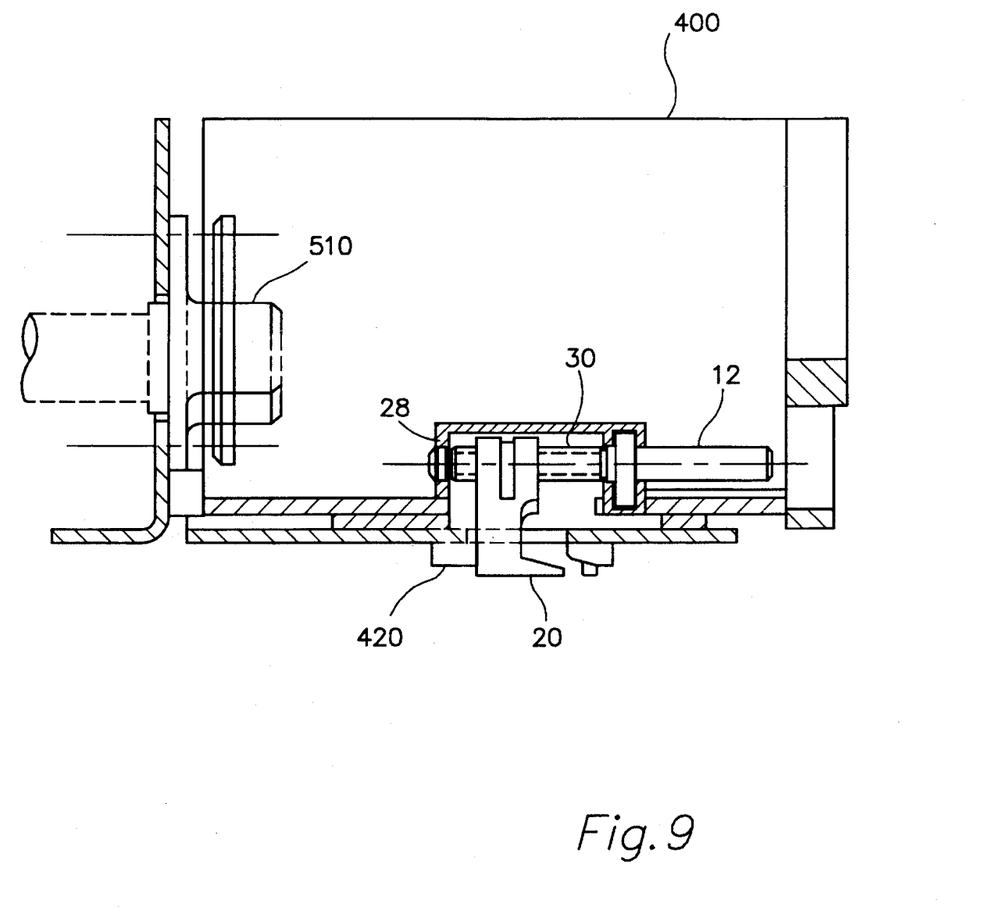
FIG. 9 shows a cross-sectional view of the removal of the LRU from the tray.

Referring to FIG. 9, there is shown the retraction and removal of the LRU from the tray. The control shaft 12 is rotated in counter clockwise direction causing the pawl to ride along the screw towards the backplate 28 of the mechanism. Since the pawl 20 is still extended, the turning of the control screw is continued with the pawl pushing against the rear block 420 causing the LRU to move in a forward direction thereby disengaging the connectors 510. When the connectors are fully disengaged, the pawl 20 rotates with the control shaft 12 and control screw 30 and retracts into the stowed or initial position. At this point the LRU 400 can be removed from the tray.

The surface 305 of retention block 300 is curved to allow the pawl to rotate to its stowed position unimpeded. Further, included in an alternative is to provide the retention block 300 in a spring loaded fashion such that if the connectors are fully mated when the LRU is inserted into the tray because of an over zealous operator, the pawl may not drop into the opening of the tray on the initial rotation of the control screw. When the control screw 12 is turned clockwise, the pawl will cause the retention block to retract against the spring until an opening is found and the pawl rotates into the opening.

While there has been shown what is considered the preferred embodiment of the present invention, it will be manifest that many changes and modification can be made therein without departing from the essential spirit and scope of the invention. It is intended, therefore, in the annexed claims to cover all such changes and modification which fall within the true scope of the invention.

We claim:

1. An apparatus for securely engaging a unit onto a tray, said tray including an opening in the bottom of the tray along with a front and rear block on the underside of the tray at the opening, said front block including a pin, said apparatus being placed in the unit at an opening in the bottom of the unit, said apparatus comprising:

a) a housing, having a front plate, a first and second side plate, a back plate, and a bottom plate creating an internal housing space, said housing being placed in the unit such that the internal housing space is opened to the opening of the bottom of the unit;

b) a control shaft, extending from outside the apparatus and accessible from the front of the unit through the front plate and into the housing space to the backplate, the portion of the control shaft in the housing space being threaded; and c) a pawl, the pawl being L-shape having a foot and a rise, the foot of the pawl having a notch in the front edge of the foot, and having a threaded hole in the rise along an axis parallel to the foot and perpendicular to the front edge of the foot, such that when the control shaft is turned the foot of the pawl extends into the opening of the tray from an initial recessed position in the housing space, and moves toward the front plate of the apparatus causing the notch of the foot to engage the pin of the tray thereby securely holding the unit to the tray.

2. An apparatus for securely engaging a unit onto a tray according to claim 1 wherein said apparatus further comprises:

a) the pawl, having a slot in the top of the rise of the pawl, the slot being perpendicular to the axis of the threaded hole and goes through the threaded hole; and b) a washer, inserted in the slot of the pawl such that the threaded portion of the control shaft goes through the washer, the washer being of a size and material to create a drag on the threaded portion of the control shaft as it turns.

3. An apparatus for securely engaging a unit onto a tray according to claim 2, wherein:

a) the front block on the underside of the tray is sloped, the height of the front block being greater at the forward portion of the block; and b) wherein the upper surface of the foot of the pawl is sloped such that the thickness of the foot increase from the front edge to the rise, the incline of the slope of the upper surface of the pawl and the front block correspond, such that a pulldown force is created on the unit as the pawl moves toward the front plate of the apparatus thereby securely holding the unit to the tray.

4. An apparatus for securely engaging a unit onto a tray according to claim 3, wherein said apparatus further comprises:

a) a retention block placed in the internal housing space such that the pawl remains extended into the hole and does not retract to its initial recessed position where the control shaft is counter-rotate to release the unit until the pawl has reached a predetermined initial position, at which point the pawl is rotated into the internal housing space of the apparatus.

5. An apparatus for securely engaging a unit onto a tray according to claim 4, further comprising:

a) a spring, the spring causing the retention block to be spring loaded, the spring loading being in a direction parallel to the control shaft, such that if the opening of the tray does not match exactly to the opening of the unit causing the pawl not to extend into the tray opening upon rotation of the control shaft, the pawl pushes against the retention block until the pawl is able to rotate into the tray opening, the retention block then returning to its original position to participate in its release function.

6. An apparatus for securely engaging a unit onto a tray according to claim 5, wherein the control shaft further comprises:

a coupler, at the external end of the control shaft, the coupler being accessible from the front of the unit.

7. An apparatus for securely engaging a unit onto a tray, said tray including an opening in the bottom of the tray along with a front and rear block on the underside of the tray at the opening, said front block including a pin, said apparatus being placed in the unit at an opening in the bottom of the unit, and further wherein the tray includes a connector at the back of the tray and the unit includes a mating connector at the back of the unit, said apparatus comprising:

a) a housing, having a front plate, a first and second side plate, a back plate, and a bottom plate creating an internal housing space, said housing being placed in the unit such that the internal housing space is opened to the opening of the bottom of the unit;

b) a control shaft, extending from outside the apparatus and accessible from the front of the unit through the front plate and into the housing space to the backplate, the portion of the control shaft in the housing space being threaded; and c) a pawl, the pawl being L-shape having a foot and a rise, the foot of the pawl having a notch in the front edge of the foot, and having a threaded hole in the rise along an axis parallel to the foot and perpendicular to the front edge of the foot, such that when the control shaft is turned the foot of the pawl extends into the opening of the tray from an initial recessed position in the housing space, and moves toward the front plate of the apparatus causing the notch of the foot to engage the pin of the tray, and when the pin is fully engaged, the unit moves backward as the control shaft is turned further thereby securely holding the unit to the tray, and causing the connector of the tray to fully mate with connector of the unit.

* * * * *